United States Patent [19]

Mitsui et al.

[11] 4,318,062

[45] Mar. 2, 1982

[54] ULTRASONIC WAVE NEBULIZER DRIVING CIRCUIT

[75] Inventors: Sadao Mitsui, Chiba; Minoru Takahashi, Funabashi; Keiichi Watanabe, Ichikawa, all of Japan

[73] Assignee: TDK Electronics Co., Ltd., Tokyo, Japan

[21] Appl. No.: 61,983

[22] Filed: Jul. 30, 1979

[30] Foreign Application Priority Data

Aug. 14, 1978 [JP] Japan ................................ 53-98244

[51] Int. Cl.[3] .......................... H03B 5/36; H03L 5/02

[52] U.S. Cl. .................................... 331/109; 310/317; 331/116 R; 331/117 R

[58] Field of Search ............... 331/109, 116 R, 117 R, 331/160, 183; 239/102, 338; 310/317; 318/130, 114; 366/116

[56] References Cited

U.S. PATENT DOCUMENTS

| | | | |
|---|---|---|---|
| 3,596,206 | 7/1971 | Loria et al. | 331/116 R |
| 3,815,048 | 6/1974 | Hamlet | 331/109 |
| 3,989,042 | 11/1976 | Mitsui et al. | 239/102 X |
| 4,044,297 | 8/1977 | Nobue et al. | 331/116 R X |

*Primary Examiner*—Siegfried H. Grimm

*Attorney, Agent, or Firm*—Wyatt, Gerber, Shoup, Scobey & Badie

[57] ABSTRACT

Voltage or current or power supplied to the piezo-electric vibrator of an ultrasonic nebulizer is sensed and used as negative feedback to stabilize oscillation in the oscillator driving circuit.

3 Claims, 5 Drawing Figures

ULTRASONIC WAVE NEBULIZER DRIVING CIRCUIT

BACKGROUND AND BRIEF DESCRIPTION OF THE INVENTION

This invention relates to an ultrasonic nebulizer driving circuit capable of stabilizing the driving power of an ultrasonic vibrator to maintain a constant nebulizing rate.

In an ultrasonic liquid nebulizer of conventional type, it is usual to drive a piezo-electric vibrator provided at the bottom of a vessel containing a liquid to be nebulized with a driving circuit so as to generate ultrasonic waves, and the energy thereof nebulizes the liquid, such as water. Generally, no output stabilization is provided, and variation of the input AC voltage (e.g. 48 V) causes a sharp variation of the nebulizing rate. Accordingly, a conventional circuit cannot be used for the atomization of kerosene in burners or the nebulization of medicine in medical apparatus, e.g., where a constant nebulizing rate is required.

Accordingly, an object of the present invention is to provide an ultrasonic wave nebulizer driving circuit capable of stabilizing the piezo-electric vibrator driving power to maintain a stabilized nebulizing rate. This object is obtained by utilizing negative feedback to stabilize oscillation, derived from sensing voltage or current or power supplied to the piezo-electric vibrator.

Explanation will be made hereinafter of presently preferred forms of ultrasonic wave nebulizer driving circuits embodying the present invention.

DETAILED DESCRIPTION

Figure 1:
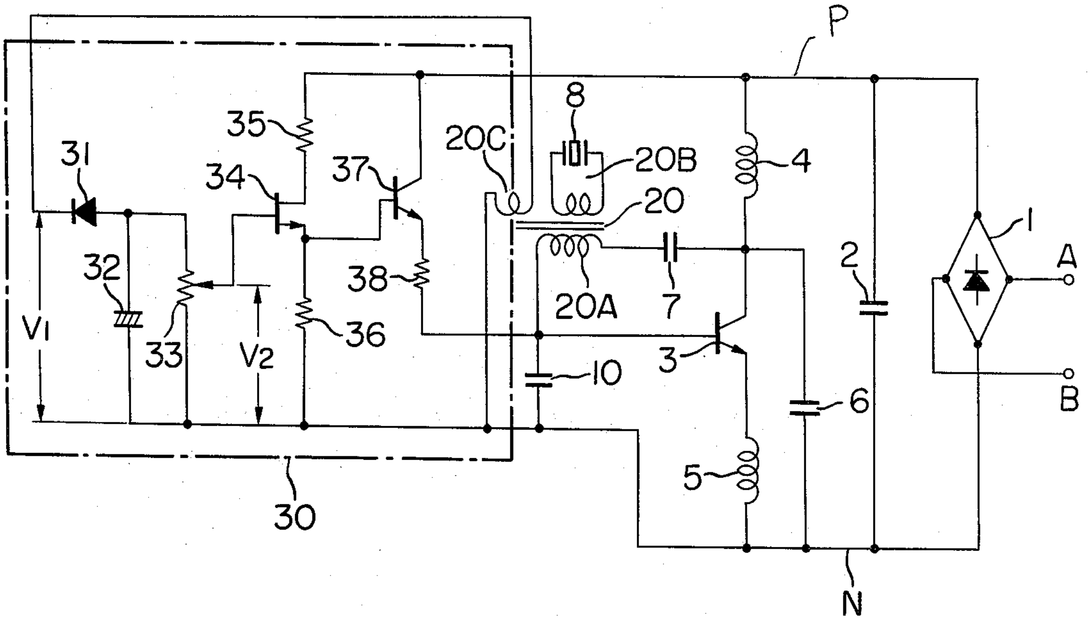
FIG. 1 is a circuit diagram of an ultrasonic nebulizer driving circuit embodying the present invention.

In the Colpitts oscillator of FIG. 1, an AC voltage applied to power source terminals A and B is rectified by a rectifier 1, then smoothed by a smoothing condenser 2. A DC voltage thus produced is supplied to a positive line P and a negative line N. The collector of a transistor 3 is connected to the positive line P through a coil 4, and the emitter of the transistor 3 is connected to the negative line N through a coil 5. A condenser 6, constituting a parallel resonance circuit together with the coil 4, is connected between the collector of the transistor 3 and the negative line N. A piezo-electric vibrator 8 having a diameter of 20 mm and a resonance frequency of 1.65 MHz, e.g., is driven by a circuit between the collector and the base of the transistor 3 that includes a condenser 7 that blocks the flow of DC current. The condenser 7 may be omitted without affecting the oscillation. A condenser 10 is connected between the base of the transistor 3 and the negative line N. The primary coil 20A of a transformer 20 is connected between the collector and the base of transistor 3 through condenser 7, and the piezo-electric vibrator 8 is connected to secondary coil 20B of the transformer.

An output stabilizing circuit 30 in accordance with the invention is provided on the base side of the transistor 3. In the output stabilizing circuit 30, a diode 31 is connected to a tertiary coil 20C of the transformer 20 to pick up the negative half of a cycle of a high frequency voltage V1 proportional to the input power, voltage or current of the piezo-electric vibrator 8. The output, rectified by the diode 31, is applied to a variable resistor 33 after being smoothed by a smoothing condenser 32. A DC voltage V2 provided by the variable resistor 33 is impressed upon the gate of an FET 34. The drain of the FET 34 is connected to the positive line P through a resistor 35, while the source or other FET electrode is connected to the negative line N through a resistor 36. The source voltage is impressed upon the base of a transistor 37 controlling the current therein; the transistor 37 supplies a base bias current to the transistor 3 through a resistor 38.

In the circuit of FIG. 1, the driving power of the piezo-electric vibrator or oscillator 8, i.e., the nebulizing rate, depends on the DC voltage V2 (the voltage between the gate and the source of the FET 34) set by the variable resistor 33 provided that there is no variation in the external conditions, such as the AC input voltage. That is because the DC voltage V2 determines the drain current of the FET 34, which in turn controls the base current of the transistor 37, which in turn controls the base bias current of the transistor 3.

Figure 2:
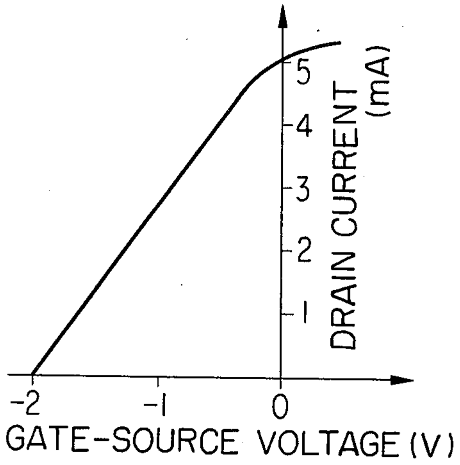
FIG. 2 shows a transfer characteristic of the FET included in the circuit of FIG. 1.
Figure 3:
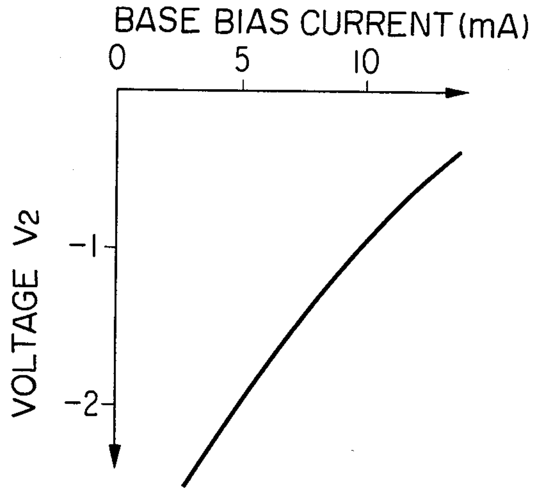
FIG. 3 is a graphical representation of the relationship between the DC voltage V2 and the base bias current of the transistor 3 in the circuit of FIG. 1.
Figure 4:
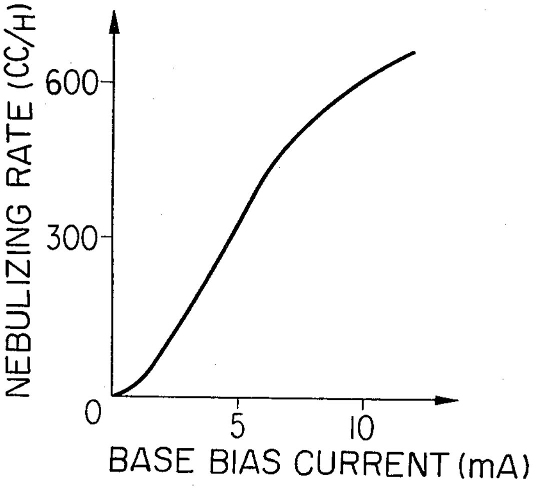
FIG. 4 is a graphical representation of the relationship between base bias current of the transistor 3 and nebulizing rate in the circuit of FIG. 1.

When the nebulizing rate increases due to variation of the AC input voltage, the high frequency voltage V1 becomes high, the DC voltage V2 increases in the negative sense, and the gate of the FET 34 is biased more in the negative sense. Since the transfer characteristic of the FET 34 is as shown in FIG. 2, the drain current decreases, the base voltage of the transistor 37 is lowered and the base bias current of the transistor 3 decreases. Consequently, the base bias current varies corresponding to the variation of the DC voltage V2 as shown in FIG. 3. Since the relation between the base bias current and the nebulizing rate is as shown in FIG. 4, the nebulizing rate varies in the negative sense according to a decrease of the bias current to cancel the increase of the nebulizing rate caused by the variation of the external condition such as increased AC input voltage.

On the other hand, when the nebulizing rate decreases, caused by variation of the AC input voltage, the high frequency voltage V1 becomes lower and the absolute value of the DC voltage V2 also becomes lower. Consequently, the gate of the FET 34 is biased in a positive direction, and the base bias current of the transistor 3 increases, causing the nebulizing rate to increase to cancel the decrease of the nebulizing rate caused by the variation of the external condition.

According to this embodiment of the invention, it is possible to maintain the nebulizing rate approximately fixed by providing an output stabilizing circuit 30 as shown in FIG. 1 to an otherwise conventional Colpitts oscillator.

Figure 5:
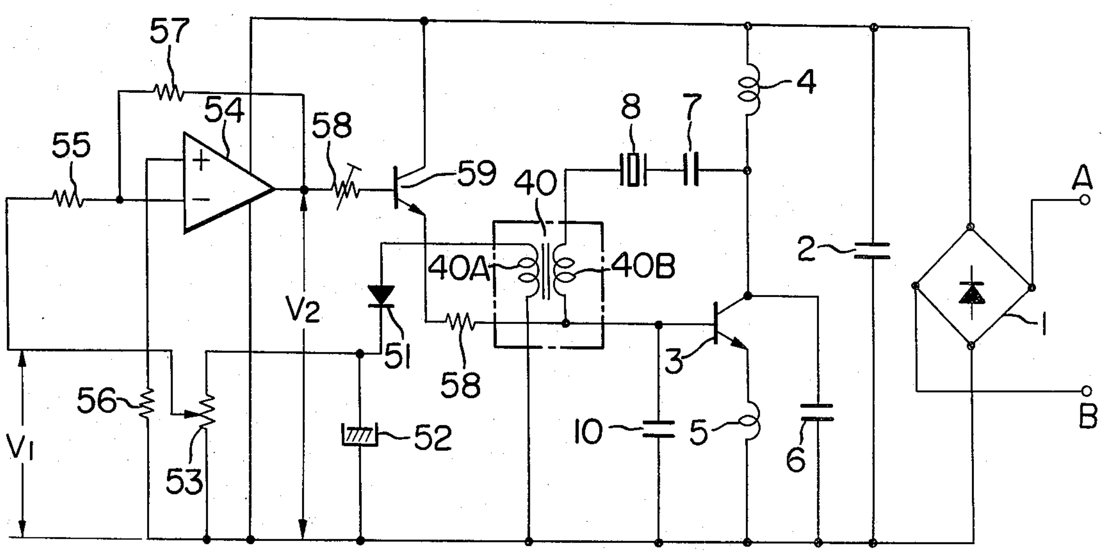
FIG. 5 is a circuit diagram of an alternative driving circuit embodying the invention.

In the embodiment of FIG. 1, the output stabilizing circuit 30 is constituted of a combination of an FET and transistors. However, an operational amplifier may be used instead of an FET and transistors, and the current and voltage of the piezo-electric vibrator 8 may be produced by connecting a current transformer in series with the piezo-electric vibrator instead of the 3-coil transformer 20 of FIG. 1. FIG. 5 shows such a modified circuit. The current and voltage from the piezo-electric vibrator 8 is taken out by current transformer 40 including primary winding 40A and secondary winding 40B. The circuit also includes RF diode 51, condenser 52, variable resistor 53 for input adjustment, operational amplifier 54, resistors 55 and 57 for adjustment of the DC amplitude of the operational amplifier, variable resistor 53 for feedback adjustment, and transistor 59 for control of the base current flowing in the base of transistor 3.

The present invention provides an ultrasonic nebulizer driving circuit capable of stabilizing the piezo-electric vibrator driving power to stabilize the nebulizing rate. Modifications to the preferred embodiments may be made. The invention thus should be defined by the following claims.

What is claimed is:

1. In an ultrasonic wave nebulizer driving circuit that includes an oscillator for driving a piezo-electric vibrator generating ultrasonic waves, the improvement wherein said driving circuit includes a transistor oscillator therein coupled to said vibrator to power said vibrator and whose base current is controlled in order to control oscillation, and further comprising an output stabilizing circuit which detects the output of said oscillator as applied to said vibrator and controls said output by negatively feeding back a part of said output to the base circuit of the transistor to vary said base current when said oscillator output varies to counteract that variation.

2. A circuit according to claim 1, wherein said vibrator is energized by one of the windings of a transformer, and wherein said output stabilizing circuit includes another winding of said transformer constituting a pickup winding used to detect the energization of said vibrator, said pickup winding is coupled to a diode to develop a DC negative feedback signal which is applied to an FET current control device, said FET current control device controls the current flow in a second transistor that in turn directly supplies said base current.

3. A circuit according to claim 1, wherein said output stabilizing circuit includes a current transformer to detect said oscillator output, a diode energized by said current transformer to develop a DC negative feedback signal, an operational amplifier receiving said DC negative feedback signal and producing a control signal that controls the current flow in a second transistor that in turn directly supplies said base current.

* * * * *